US009934873B2

(12) United States Patent
Gajavelly et al.

(10) Patent No.: US 9,934,873 B2
(45) Date of Patent: Apr. 3, 2018

(54) DELAYED EQUIVALENCE IDENTIFICATION (71) Applicant: International Business Machines Corporation, Armonk, NY (US)

(72) Inventors: Raj Kumar Gajavelly, Warangal (IN); Ashutosh Misra, Bangalore (IN); Pradeep Kumar Nalla, Bangalore (IN); Rahul M. Rao, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/662,354

(22) Filed: Jul. 28, 2017

(65) Prior Publication Data

US 2017/0365362 A1   Dec. 21, 2017

Related U.S. Application Data

(63) Continuation of application No. 15/188,082, filed on Jun. 21, 2016, now abandoned.

(51) Int. Cl.
*G11C 7/10* (2006.01)
*G11C 29/54* (2006.01)
*G11C 7/22* (2006.01)

(52) U.S. Cl.
CPC ............... *G11C 29/54* (2013.01); *G11C 7/10* (2013.01); *G11C 7/22* (2013.01)

(58) Field of Classification Search
CPC .................... G11C 7/10; G11C 7/22
USPC ................................. 365/189.05
See application file for complete search history.

(56) References Cited

U.S. PATENT DOCUMENTS

| 8,099,703 | B1 | 1/2012 | Manovit et al. |
| 9,547,043 | B2 * | 1/2017 | Ahmed .......... G01R 31/318547 |
| 2013/0312051 | A1 | 11/2013 | Srebranig |
| 2016/0169970 | A1 | 6/2016 | Asaad et al. |
| 2016/0344373 | A1 | 11/2016 | Langhammer et al. |

OTHER PUBLICATIONS

Case et al., "Optimal Redundancy Removal without Fixedpoint Computation", FMCAD 2011, © 2011 IEEE, 8 pages.
Chang et al., "Safe Delay Optimization for Physical Synthesis", EECS Department, University of Michigan, Ann Arbor, MI 48109-2122, printed on Apr. 1, 2016, 6 pages.

(Continued)

*Primary Examiner* — Fernando Hidalgo
(74) *Attorney, Agent, or Firm* — Gilbert Harmon, Jr.

(57) ABSTRACT

A method includes configuring an integrated circuit comprising one or more registers to provide a free running clock in the integrated circuit, simulating N clock cycles in the circuit to provide performance results for one or more registers in the circuit, wherein N is a selected number of staging levels, selecting one of the one or more registers, comparing the performance results for the selected register to performance results for each of the remaining registers to provide one or more equivalent delay candidate registers, and verifying each of the one or more equivalent delay candidate registers to provide one or more confirmed equivalent delay registers. A corresponding computer program product and computer system are also disclosed.

1 Claim, 5 Drawing Sheets

(56) References Cited

OTHER PUBLICATIONS

Coudert, Olivier, "Gate Sizing for Constrained Delay/Power/Area Optimization", IEEE Transactions on Very Large Scale Integration (VLSI) Systems, vol. 5, No. 4, Dec. 1997, © 1997 IEEE, 8 pages.

Moiseev et al., "Power-Delay Optimization in VLSI Microprocessors by Wire Spacing", ACM Transactions on Design Automation of Electronic Systems, vol. 14, No. 4, Article 55, Pub. date: Aug. 2009, 28 pages.

Mony et al., "Speculative Reduction-Based Scalable Redundancy Identification", 978-3-9810801-5-5/Date09 © 2009 EDAA, 6 pages.

Gajavelly et al., "Delayed Equivalence Identification", U.S. Appl. No. 15/188,082, filed Jun. 21, 2016, 28 pages.

IBM Appendix P, list of patents and patent applications treated as related, Feb. 6, 2017, 2 pages.

\* cited by examiner

DELAYED EQUIVALENCE IDENTIFICATION

BACKGROUND OF THE INVENTION

The present invention relates generally to the field of integrated circuit design, and more specifically to identifying delayed equivalences within an integrated circuit.

An integrated circuit can be designed to include a plurality of latches. Often, these circuits are designed using a single latch model for all of the latches in a circuit. Using a single latch model can simplify the design constraints on the integrated circuit. However, in other cases, particularly when there is little logic between two pipeline stages, different latch models may be used to meet certain needs of the circuit. For example, latch models that consume less power can be implemented selectively to minimize the power consumption of the entire circuit. In some cases, different latch models may be clock gated differently.

SUMMARY

As disclosed herein, a method includes configuring an integrated circuit comprising one or more registers to provide a free running clock in the integrated circuit, simulating N clock cycles in the circuit to provide performance results for one or more registers in the circuit, wherein N is a selected number of staging levels, selecting one of the one or more registers, comparing the performance results for the selected register to performance results for each of the remaining registers to provide one or more equivalent delay candidate registers, and verifying each of the one or more equivalent delay candidate registers to provide one or more confirmed equivalent delay registers. A corresponding computer program product and computer system are also disclosed.

DETAILED DESCRIPTION

Existing methods for identifying scenarios in which latches are clock gated differently and delay equivalences (or delayed equivalences) are present may be unreliable. Notably, existing methods may only identify equivalences in a current clock cycle, and offer no insight regarding other cycles. The present invention provides a scalable and automated method for identifying the functional delay equivalences within an integrated circuit without losing design testability.

Figure 1:
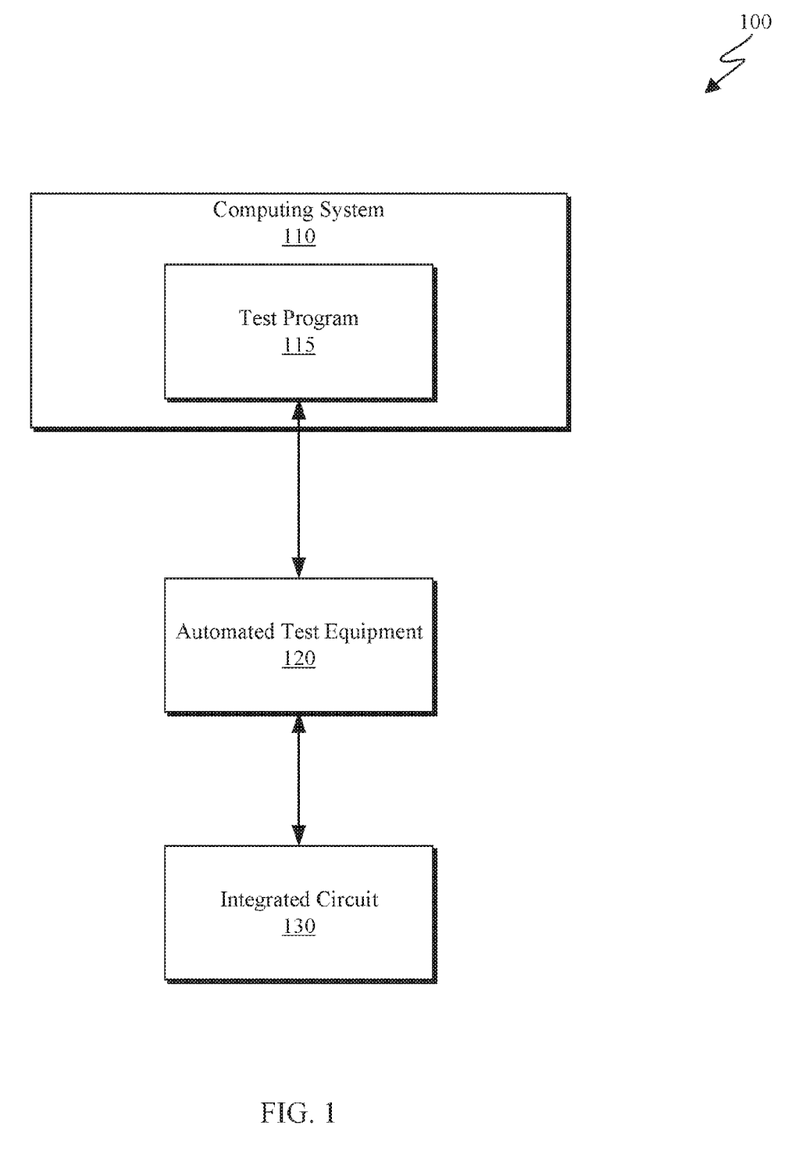
FIG. 1 is a block diagram depicting one example of a circuit testing environment in accordance with some embodiments of the present invention.

FIG. 1 is a block diagram depicting one example of a circuit testing environment 100 in accordance with some embodiments of the present invention. As depicted, testing environment 100 includes computer system 110, automated test equipment 120, and integrated circuit 130. Testing environment 100 is one example of a system in which an equivalence delay identification method may be utilized.

Computer system 110 can be a desktop computer, a laptop computer, a specialized computer server, or any other computer system known in the art. In some embodiments, computer system 110 represents a computer system utilizing clustered computers and components to act as a single pool of seamless resources. In general, computer system 110 is representative of any electronic device, or combination of electronic devices, capable of executing machine-readable program instructions, as described in greater detail with regard to FIG. 5. As depicted, computer system 110 includes a test program 115. In one or more embodiments, test program 115 is configured to receive performance results from automated test equipment 120. Test program 115 may be configured to execute a circuit evaluation method, a delay equivalence detection method, or a register analysis method, the details of which are discussed with respect to FIG. 2, FIG. 3, and FIG. 4, respectively.

Automated test equipment (ATE) 120 may be any apparatus that performs tests on a device, known as the Device Under Test (DUT). In the depicted embodiment, the DUT is integrated circuit 130. Design-For-Test (DFT), consists of integrated circuit design techniques that add testability features to a hardware product design. The added features make it easier to develop and apply manufacturing tests to the designed hardware. The purpose of manufacturing tests is to validate that the product hardware contains no manufacturing defects that could adversely affect the product's correct functioning. ATE 120 may therefore be configured to execute one or more manufacturing tests to validate the integrated circuit 130. ATE 120 may be configured to provide test results to test program 115 within computer system 110.

Integrated circuit 130 may be an integrated circuit to be tested by automated test equipment 120. In some embodiments, integrated circuit 130 comprises a plurality of latches connected by one or more scan connections. The scan connections may be used by ATE 120 to test a set of performance metrics for integrated circuit 130.

Figure 2:
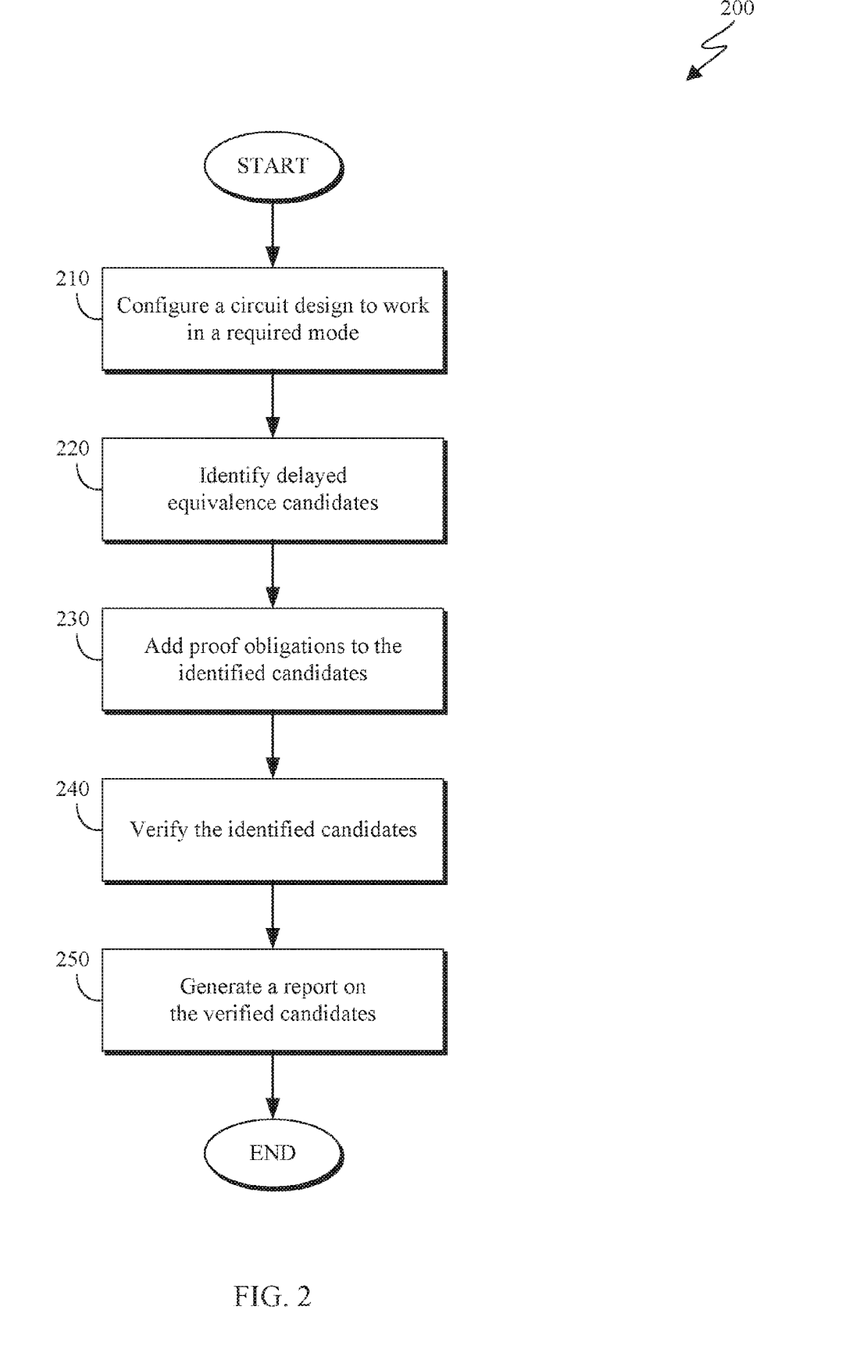
FIG. 2 is a flowchart depicting one example of a circuit evaluation method in accordance with one or more embodiments of the present invention.

FIG. 2 is a flowchart depicting one example of a circuit evaluation method 200 in accordance with one or more embodiments of the present invention. As depicted, circuit evaluation method 200 includes configuring (210) a circuit design to work in a specified mode, identifying (220) equivalent delay candidate registers, adding (230) proof obligations to the identified candidates, verifying (240) the identified candidates, and generating (250) a report on the verified candidates. Circuit evaluation method 200 may enable the identification of delay equivalences in an integrated circuit.

Configuring (210) a circuit design to work in a specified mode may include adding necessary constraints on the circuit to make a clock free running. In one embodiment, configuring (210) a circuit design to work in a specified mode includes force-enabling a pin of a clock gated circuitry to be Boolean TRUE. The constraints may be applied to ensure a clock signal corresponding to the circuit design is non-gated and uninterrupted.

Identifying (220) equivalent delay candidate registers may include executing a delay equivalence identification method to provide one or more equivalent delay candidate registers corresponding to the circuit. One embodiment of an appropriate delay equivalence identification method is discussed with respect to FIG. 3.

Adding (230) proof obligations to the identified candidates may include adding a set of conditions the identified candidates must meet in order to be verified as exhibiting delay equivalence. For example, for a register R whose input is D and output is Q, a proof obligation may be that a check signal (wherein the check signal is defined as Check=Next (D)^Q) should always be Boolean FALSE. In one or more embodiments, adding (230) proof obligations further includes providing said proof obligations to a module configured to verify the identified candidates.

Verifying (240) the identified candidates may include performing unbounded sequential verification on the registers identified as equivalence delay candidates. In one embodiment, the targets are partitioned according to the level to which they correspond. Each partition of one or more targets is then verified individually to provide one or more confirmed candidates.

Generating (250) a report on the confirmed candidates may include providing a report identifying which of the one or more identified candidates have been verified. These are the candidates that exhibit delay equivalence. The generated report may be provided to a user such that the registers exhibiting delay equivalence can be altered in an appropriate manner.

Figure 3:
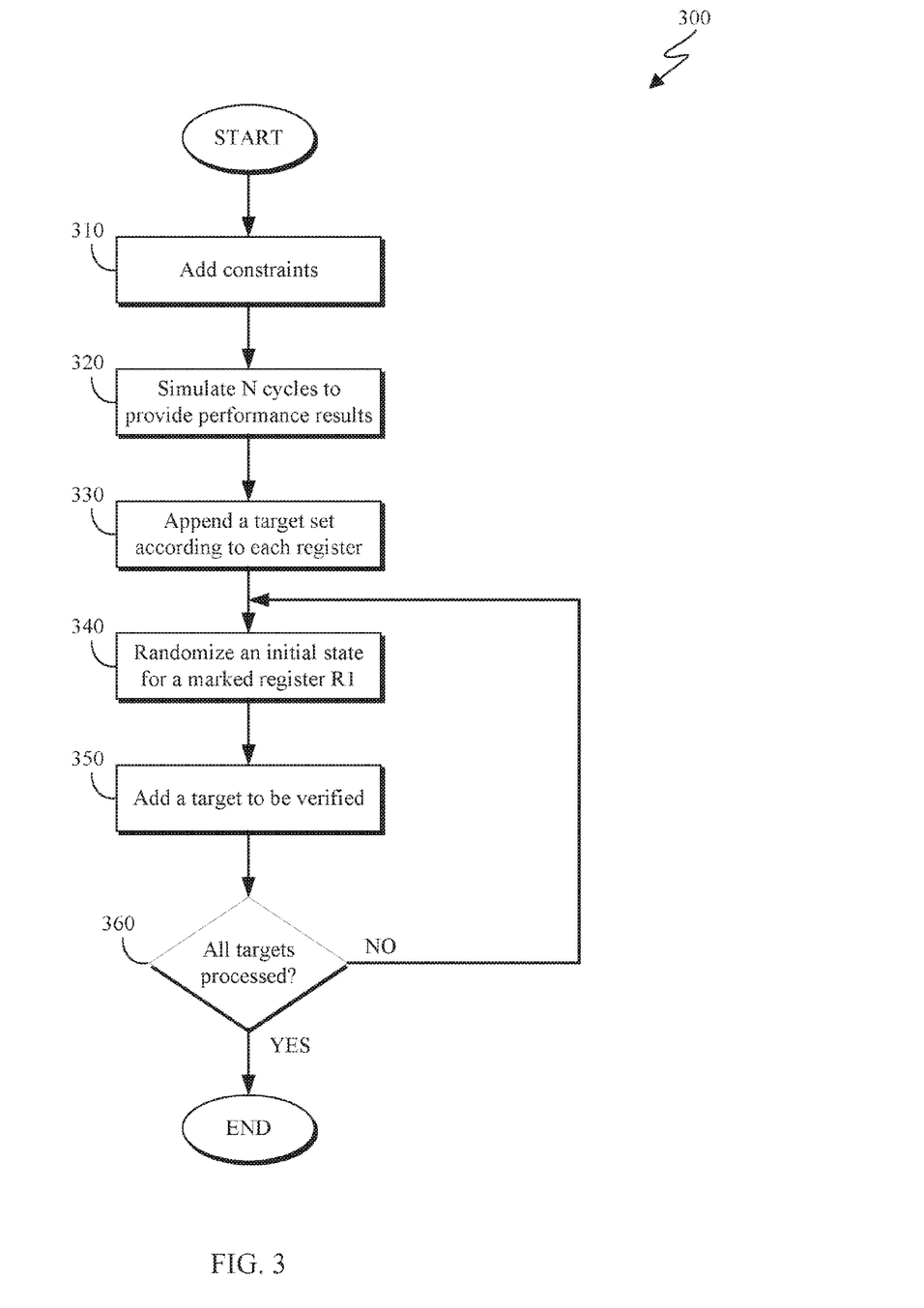
FIG. 3 is a flowchart depicting one example of a delay equivalence detection method in accordance with some embodiments of the present invention.

FIG. 3 is a flowchart depicting one example of a delay equivalence detection method 300 in accordance with some embodiments of the present invention. As depicted, delay equivalence identification method 300 includes adding (310) necessary constraints to make a clock free running, simulating (320) N clock cycles to provide performance results for the circuit, appending (330) a target set according to each register, randomizing (340) an initial state for a marked register, adding (350) a target to be verified, and determining (360) if all targets have been processed. Delay equivalence identification method 300 may detect registers in an integrated circuit that exhibit delay equivalence.

Adding (310) necessary constraints to make a clock free running may include implementing constraints on the circuit to ensure a clock implemented in the circuit is free running. In one embodiment, configuring (210) a circuit design to work in a specified mode includes force-enabling a pin of a clock gated circuitry to a Boolean TRUE position. The constraints may be applied to ensure the clock signal is non-gated and uninterrupted.

Simulating (320) N clock cycles to provide performance results for the circuit may include performing a simulation over a number of cycles N, where N is a predetermined number of staging levels. In one or more embodiments, the selected number of staging levels N corresponds to a multi-level structural fan-in connection of the latches in the circuit. For example, if the circuit has a 6 level structural fan-in connection of the latches, then the simulation will be performed over 6 clock cycles, and so on. The provided performance results may include the time it takes for each cycle to complete, as well as an average cycle completion time. Simulating (320) N clock cycles may further include providing performance results to a comparator module to be compared.

Appending (330) a target set according to each register may include executing a register analysis method to identify targets to be appended to the target set. One embodiment of an appropriate register analysis method is discussed with respect to FIG. 4. Appending (330) a target set according to each register may further include identifying one or more equivalent delay candidate registers according to the performance results for the circuit.

Randomizing (340) an initial state for a marked register may include randomly selecting state conditions for one of the previously marked registers. Typically, in any design, an initial state is concrete. Concrete in this case indicates all registers are initialized with a fixed value of 0 or 1 or defined circuitry. In one or more embodiments of the present invention, each register is initialized with a primary random input, which can take any arbitrary value. In one or more embodiments, the initial states for multiple marked registers are randomized simultaneously.

Adding (350) a target to a set of targets to be verified may include adding a target corresponding to a marked register to a set of targets to be verified. In some embodiments, only one target per register is appended to the set of targets to be verified. Adding (350) a target to be verified may include appending a stored list of targets to include the target. In some embodiments, adding (350) a target to be verified additionally includes verifying the set of targets.

Determining (360) if all targets have been processed may include determining if each target has been added to the set of targets to be verified. In some embodiments, determining (360) if all targets have been processed also includes determining if the initial state of each marked register has been randomized with respect to the appropriate target t. If it is determined that all targets have been processed (360, yes branch), the method ends. If all targets have not been processed (360, no branch), the method continues by returning to randomizing (340) an initial state for a marked register with respect to the appropriate target.

Figure 4:
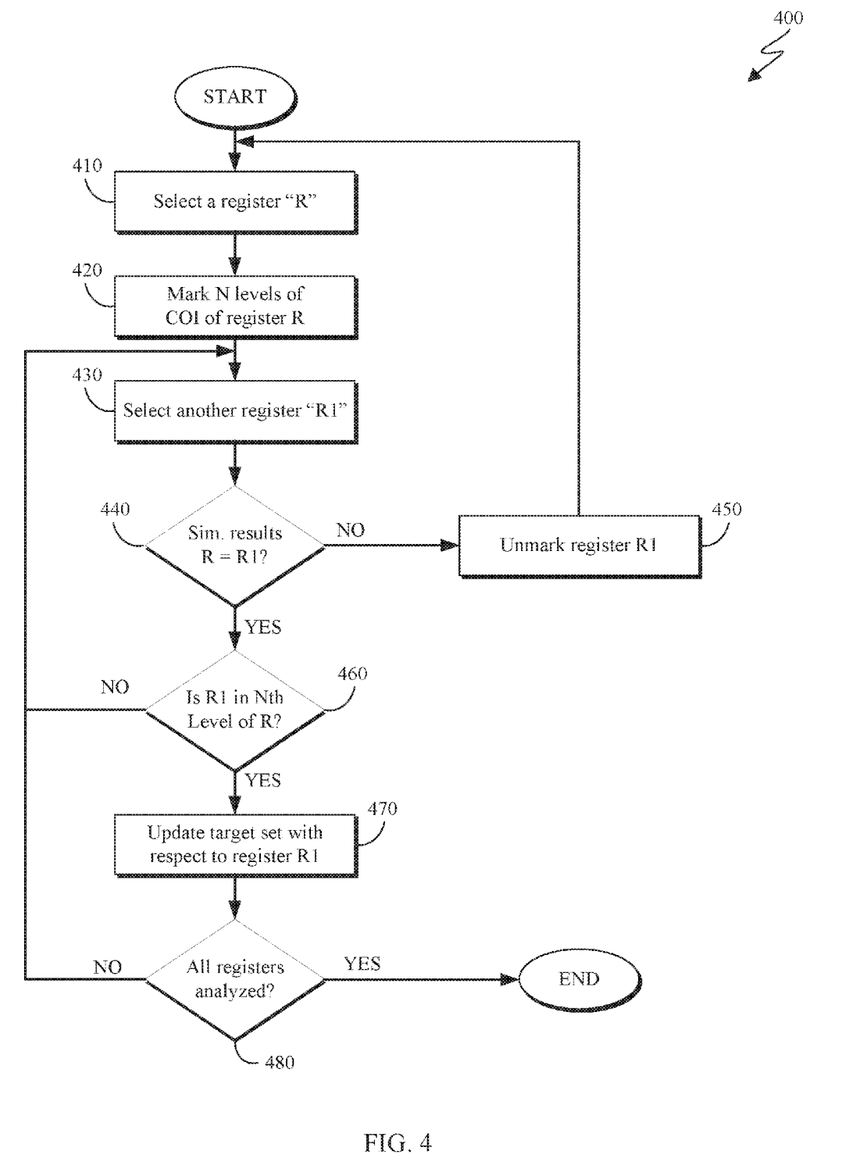
FIG. 4 is a flowchart depicting one example of a register analysis method in accordance with at least one embodiment of the present invention.

FIG. 4 is a flowchart depicting one example of a register analysis method 400 in accordance with at least one embodiment of the present invention. As depicted, register analysis method 400 includes selecting (410) a register R, marking (420) N levels associated with the selected register R, selecting (430) a different register R1, determining (440) if the simulation results for register R are the same as those for register R1, unmarking (450) register R1, determining (460) if register R1 is in the Nth level of register R, updating (470) a target set with respect to register R1, and determining (480) if all registers have been analyzed. Register analysis method 400 may create a target set comprising equivalent delay candidate registers.

Selecting (410) a register R may include selecting a register of interest, henceforth referred to as register R, from a set of all registers in an integrated circuit. The register R and any associated performance test results associated with register R serve as a control to which other registers will be compared.

Marking (420) N levels associated with the selected register R may include creating a tag corresponding to the register R indicating a number of levels N associated with the register. In one or more embodiments, the number of levels N associated with the register corresponds to a multi-level structural fan-in connection of the latches in the circuit, as previously defined.

Selecting (430) a different register R1 may include selecting a register, henceforth referred to as register R1, to be analyzed with respect to the previously selected register of interest R. In some embodiments, register R1 corresponds to a register nearest to register R that has not been analyzed. In other embodiments, register R1 is selected at random from the set of registers yet to be analyzed.

Determining (440) if the simulation results for register R are the same as those for register R1 may include comparing one or more performance results from register R to the corresponding performance results from register R1. In one embodiment, each available performance result from register R is compared to the corresponding performance result from register R1 to determine whether each of the results match. In other embodiments, a subset of one or more performance results may be indicated as the critical results to be compared, enabling some results which may provide little to no insight to be ignored. Determining (440) if the simulation results are the same may include providing a performance result from register R and a performance result from register R1 to a comparator circuit. If the simulation results for register R are the same as those for register R1 (440, yes branch), the method continues by determining (460) if register R1 is in the Nth level of register R. If the simulation results for register R are not the same as those for register R1 (440, no branch), the method continues by unmarking (450) register R1.

Unmarking (450) register R1 may include applying a tag to register R1 indicating that register R1 does not match register R's performance. Unmarking (450) register R1 may comprise adding register R1 to a set of registers that do not exhibit delay equivalence with respect to register R. In some embodiments, where register analysis method 400 is executed multiple times, the set of registers that do not exhibit delay equivalence with respect to register R may be the set from which a control register is selected for a next iteration of the method.

Determining (460) if register R1 is in the Nth level of register R may include determining whether register R1 is in the FANIN cone of register R. In one or more embodiments, R1 is considered to be in the Nth level of another register R if register R1 is in the FANIN cone of register R with a sequential depth of N, where N is as previously defined. If it is determined that register R1 is in the Nth level of register R (460, yes branch), the method continues by updating a target set with respect to register R1. If it is determined that R1 is not in the Nth level of register R (460, no branch), the method continues by selecting (430) another register.

Updating (470) a target set with respect to register R1 may include appending targets corresponding to register R1 to a target set. In one or more embodiments, the target set is appended according to the statement.

Target_Set·ADD($R==N\_Delay(R1)$)

Target_Set·ADD(NOT($R$)==$N\_Delay(R1)$)

The target set may include targets to be verified as equivalent delay candidate registers.

Determining (480) if all registers have been analyzed may include checking to see if each register in the circuit has been compared to the selected control register R. If all registers have been analyzed (480, yes branch), the method ends. If all registers have not been analyzed (480, no branch), the method continues by selecting (430) another register R1.

Figure 5:
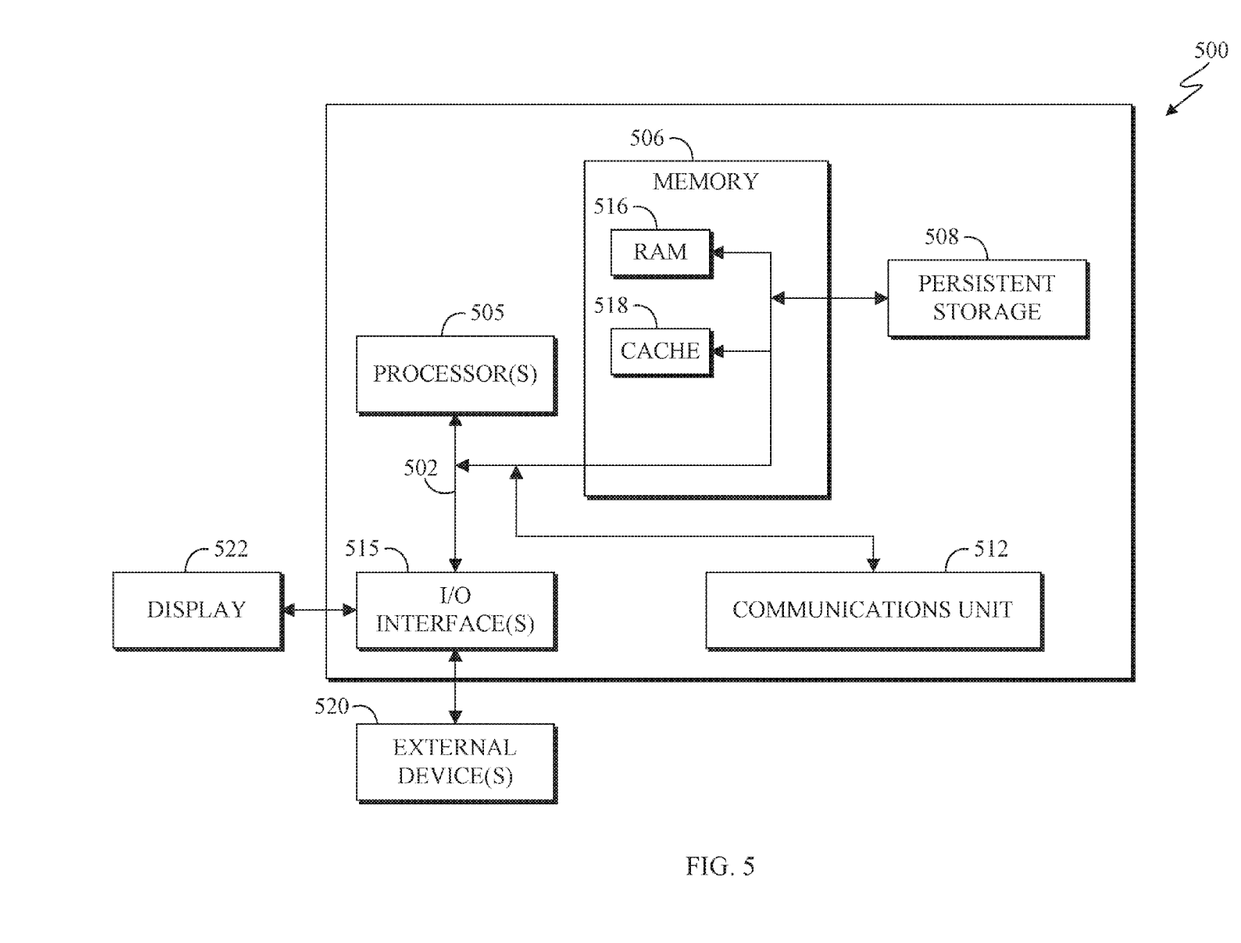
FIG. 5 depicts a block diagram of one example of a computer, in accordance with some embodiments of the present invention.

FIG. 5 depicts a block diagram of components of computer 500 in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

As depicted, the computer 500 includes communications fabric 502, which provides communications between computer processor(s) 505, memory 506, persistent storage 508, communications unit 512, and input/output (I/O) interface(s) 515. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer-readable storage media. In this embodiment, memory 506 includes random access memory (RAM) 516 and cache memory 518. In general, memory 506 can include any suitable volatile or non-volatile computer-readable storage media.

One or more programs may be stored in persistent storage 508 for access and/or execution by one or more of the respective computer processors 505 via one or more memories of memory 506. In this embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer-readable storage medium that is also part of persistent storage 508.

Communications unit 512, in these examples, provides for communications with other data processing systems or devices. In these examples, communications unit 512 includes one or more network interface cards. Communications unit 512 may provide communications through the use of either or both physical and wireless communications links.

I/O interface(s) 515 allows for input and output of data with other devices that may be connected to computer 500. For example, I/O interface 515 may provide a connection to external devices 520 such as a keyboard, keypad, a touch screen, and/or some other suitable input device. External devices 520 can also include portable computer-readable storage media such as, for example, thumb drives, portable optical or magnetic disks, and memory cards. Software and data used to practice embodiments of the present invention can be stored on such portable computer-readable storage media and can be loaded onto persistent storage 508 via I/O interface(s) 515. I/O interface(s) 515 also connect to a display 522.

Display 522 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computer/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computer/processing device receives computer readable program instructions from the network and forwards the computer readable program instructions for storage in a computer readable storage medium within the respective computer/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:

configuring an integrated circuit comprising one or more registers by force-enabling a pin of a clock gated circuitry to be Boolean TRUE;

driving N clock cycles in the circuit to provide performance results for one or more registers in the circuit, wherein N is a selected number of staging levels corresponding to a multi-level structural FANIN connection of the one or more registers in the circuit;

selecting one of the one or more registers;

comparing the performance results for the selected register to performance results for each of the remaining registers to provide one or more equivalent delay candidate registers, wherein comparing the performance results for the selected register to performance results for each of the remaining registers includes determining whether each of the remaining registers is in a FANIN cone of the selected register;

randomizing an initial state for the one or more equivalent delay candidate registers; and verifying that a check signal is always Boolean false for a selected register to provide one or more confirmed equivalent delay registers.

* * * * *